(12) United States Patent
Mayer et al.

(10) Patent No.: US 7,760,042 B2
(45) Date of Patent: Jul. 20, 2010

(54) PHASE LOCKED LOOP BASED FREQUENCY MODULATOR WITH ACCURATE OSCILLATOR GAIN ADJUSTMENT

(75) Inventors: Thomas Mayer, Linz (AT); Andreas Roithmeier, Munich (DE)

(73) Assignee: Infineon Technologies AG, Munich (DE)

( * ) Notice: Subject to any disclaimer, the term of this patent is extended or adjusted under 35 U.S.C. 154(b) by 16 days.

(21) Appl. No.: 12/147,275

(22) Filed: Jun. 26, 2008

(65) Prior Publication Data

US 2009/0322439 A1    Dec. 31, 2009

(51) Int. Cl.
  *H03C 3/09* (2006.01)
  *H03C 3/06* (2006.01)
(52) U.S. Cl. ..................... 332/128; 332/123
(58) Field of Classification Search .................. 332/117, 332/118, 119, 123, 124, 127, 128; 331/16, 331/23, 1 A; 455/102, 113; 375/376
  See application file for complete search history.

(56) References Cited

U.S. PATENT DOCUMENTS

| 5,983,077 A * | 11/1999 | Dent ........................... 455/44 |
| 6,211,747 B1 * | 4/2001 | Trichet et al. ................ 332/128 |
| 6,674,331 B2 * | 1/2004 | McDowell ..................... 331/16 |
| 7,068,112 B2 | 6/2006 | Götz et al. |
| 2008/0042753 A1 * | 2/2008 | Bauernfeind et al. ......... 331/1 A |

* cited by examiner

*Primary Examiner*—Robert Pascal
*Assistant Examiner*—Ryan Johnson
(74) *Attorney, Agent, or Firm*—Eschweiler & Associates, LLC

(57) ABSTRACT

A frequency modulator includes a tuning circuit configured to determine a nominal gain characteristic of a digitally controlled oscillator (DCO) in a first mode, and to determine an actual gain characteristic of the DCO in a second mode using the nominal gain characteristic. The frequency modulator also comprises a modulation circuit comprising the DCO coupled to the tuning circuit, configured to modulate a frequency of a DCO output signal with a modulation signal input, and to scale the modulated DCO output signal based on the actual gain characteristic in the second mode to provide gain compensation and frequency modulation of the DCO. The tuning circuit may include a select switch to couple a minimal and maximal tuning word to the DCO in the first mode and an actual operating point word in the second mode to the DCO to determine the nominal gain characteristic.

23 Claims, 2 Drawing Sheets

Oscillator Control Characteristic

Oscillator Gain Characteristic
(201 = derivative of 101)

PHASE LOCKED LOOP BASED FREQUENCY MODULATOR WITH ACCURATE OSCILLATOR GAIN ADJUSTMENT

BACKGROUND

In modern communications systems, phase locked loops used for direct carrier frequency modulation require accurate knowledge of the controlled oscillator gain, particularly when the modulation signal shows a large frequency bandwidth. The reason for this is that when the modulation signal has a larger bandwidth than the PLL loop bandwidth, methods to increase the modulation bandwidth of the PLL are generally implemented. These methods require an accurate knowledge of the oscillator gain.

One method to increase the modulation bandwidth of a PLL is pre-emphasis of the modulation signal, in order to compensate for the lowpass characteristic of the PLL transfer function. This method works well for narrowband modulation schemes such as GSM. To be able to compensate the loop transfer function, the open loop gain has to be known with an accuracy of about 5%.

A more advanced wideband modulation method is 2-point modulation. This method utilizes two additive modulation paths, where one has a highpass transfer function and the second one a lowpass transfer function. The sum of both paths is ideally not limited anymore in bandwidth (except for very high frequency offsets). For a good matching between the two paths, the oscillator gain should generally be known to within an allowed deviation of about 1.5-2%. However, the oscillator gain of fully integrated PLLs varies much more than these values, and obtaining the required gain measurement accuracy is difficult to achieve, particularly with the non-linear oscillator control characteristic.

Accordingly, there is a continued need to improve PLL based frequency modulators having accurate gain control.

SUMMARY

The following presents a simplified summary in order to provide a basic understanding of one or more aspects of the disclosure. This summary is not an extensive overview, and is neither intended to identify key or critical elements of the disclosure, nor to delineate the scope thereof. Rather, the primary purpose of the summary is to present some concepts in a simplified form as a prelude to the more detailed description that is presented later.

In one embodiment, a frequency modulator is disclosed that includes a tuning circuit configured to determine a nominal gain characteristic of a digitally controlled oscillator (DCO) in a first mode, and to determine an actual gain characteristic of the DCO in a second mode using the nominal gain characteristic. The frequency modulator also comprises a modulation circuit comprising the DCO coupled to the tuning circuit, configured to modulate a frequency of a DCO output signal with a modulation signal input, and to scale the modulated DCO output signal based on the actual gain characteristic in the second mode to provide gain compensation and frequency modulation of the DCO.

In one embodiment, a method is disclosed for direct carrier frequency modulation by determining a nominal gain in one of an open loop and a closed loop modes and an actual gain in a closed loop mode to adjust the gain of the digitally controlled oscillator (DCO) of a frequency modulator. The method comprises selecting one of the open or closed loop modes of the frequency modulator, tuning the DCO with a minimal tuning word value and measuring the minimal DCO frequency (or tuning the DCO closed loop to a minimal frequency and measuring the minimal tuning word value), and tuning the DCO with a maximal tuning word value and measuring the maximal DCO frequency (or tuning the DCO closed loop to a maximal frequency and measuring the maximal tuning word value). The method also includes determining the nominal gain of the DCO based on the minimal and maximal DCO frequency measurements, applying a modulation signal to the frequency modulator, and applying a reciprocal of the nominal gain to the frequency modulator. Finally, the method includes selecting the closed loop mode of the frequency modulator, determining the actual gain of the DCO by reading the actual tuning word value at the DCO, determining a new gain value from the actual tuning word value in the closed loop mode, and applying a reciprocal of the new gain value to the frequency modulator.

The following description and annexed drawings set forth in detail certain illustrative aspects and implementations. These are indicative of only a few of the various ways in which the principles may be employed.

DETAILED DESCRIPTION

Figure 1:
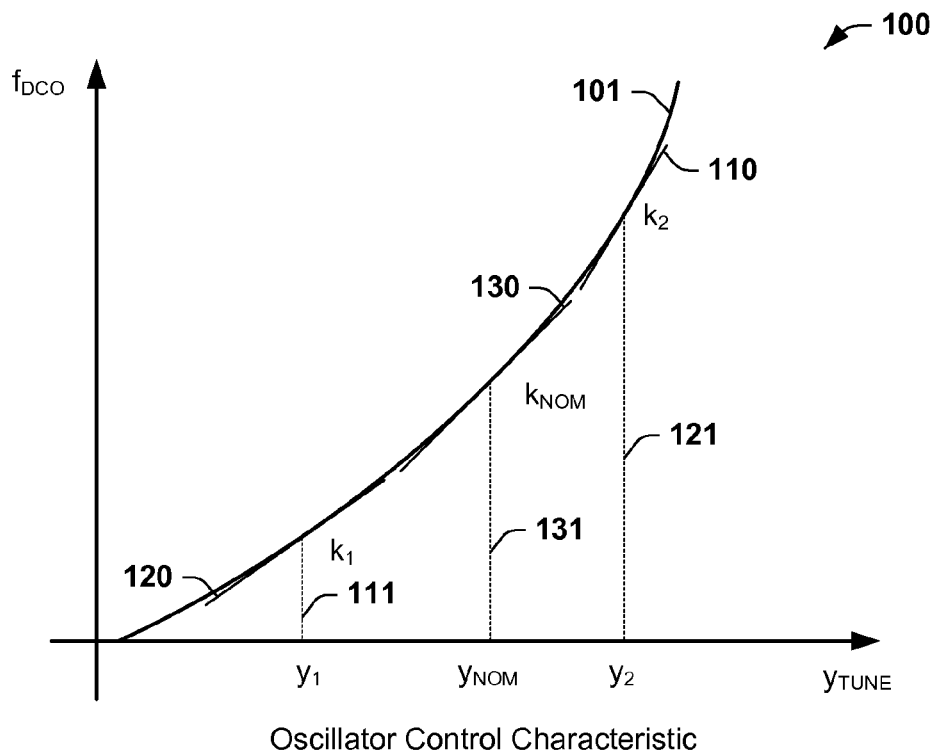
FIG. 1 is a plot of the nonlinear control characteristic of an oscillator of a phase locked loop used in accordance with one embodiment of the disclosure.

One or more implementations will now be described with reference to the attached drawings, wherein like reference numerals are used to refer to like elements throughout. Systems and methods are disclosed for frequency modulating and gain compensating the nonlinear response of a phase locked loop (PLL) based modulator, by measuring the nominal gain of the DCO in an open loop mode and compensating for the gain at the actual operating point in a closed loop mode.

Because phase locked loops used for direct carrier frequency modulation of communications systems, and particularly mobile communications systems require accurate knowledge of the nonlinear characteristics of the digitally controlled oscillator, there is a continued need to improve these frequency modulators. Although these DCO frequency and gain measurements can be made, obtaining the required gain measurement accuracy is difficult to achieve, particularly with the non-linear oscillator control characteristic. The term "DCO gain" herein, is the DCO frequency change in Hz per LSB change of the digital tuning signal.

In PLLs using the aforementioned pre-emphasis method, the required measurement accuracy for the oscillator gain measurement can be achieved by initially measuring the DCO gain with on-chip counters. In fully-digital PLLs (digital phase detector, digital loop filter, digitally controlled oscillator), two-point modulation is used most commonly, due to the fact that the only deviation between the highpass and lowpass path is the DCO gain. However, the stringent accuracy requirement can not be achieved easily by a single DCO gain measurement as may be used in a prior art system.

The limiting fact of the simple two-measurement method is the nonlinearity of the oscillator control characteristic. Usually, the oscillator utilizes capacitors which are switched in parallel to an inductance-capacitor-tank (LC-tank). The characteristic of this control method is in general nonlinear.

A simple model of the controlled oscillator frequency can be written as:

$$f = \frac{1}{2\pi\sqrt{L(C_{FIX} + (y_{MAX} - y)C_{VAR})}}, \quad 1)$$

where f denotes the oscillator frequency, L is the tank inductance, $C_{FIX}$ is the constant capacitance of the tank which determines the base frequency, $C_{VAR}$ is one switchable unit capacitance and y is the digital oscillator control word. $y_{MAX}-y$ determines how many unit capacitors are switched on. $y_{MAX}$ is the maximum of the tuning input word. y is not multiplied directly with $C_{VAR}$ in order to get a positive DCO gain.

From this relation it is evident, that the control characteristic is nonlinear. In addition, due to the square root relationship, the nonlinearity may be estimated by a 2nd order (quadratic) term. Numeric examples and simulations show, that a 2nd order approximation is feasible for a real implementation. What can also be seen, is, that the nonlinearity is determined mainly by the design and can therefore be predicted with reasonable accuracy.

So if the control characteristic is approximately of $2^{nd}$ order, the gain characteristic (derivative) of the oscillator will be close to linear. This means the gain has a minimum at the one end of the control range and a maximum at the other end of the control range, and the characteristic between the minimum and maximum is linear. The wanted operation point may be in the center of the total range, as shown in the following figures.

Turning now to FIG. 1, a plot 100 is illustrated of the nonlinear control characteristic 101 of an oscillator of a phase locked loop, for example, used in accordance with one embodiment of the disclosure.

Figure 2:
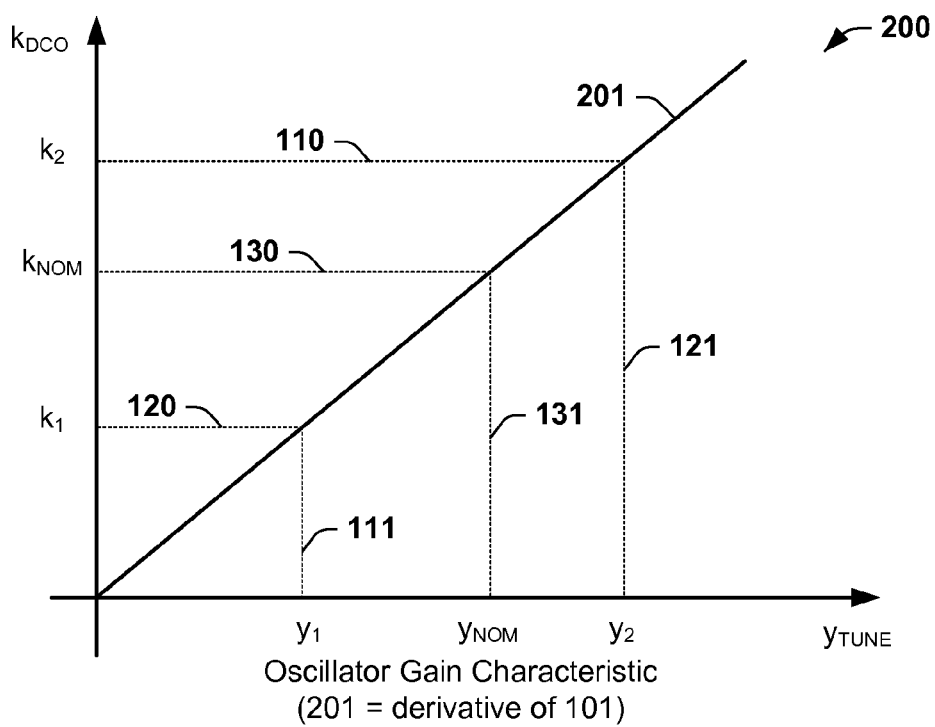
FIG. 2 is a plot of the oscillator gain characteristic of a phase locked loop used in accordance with one embodiment of the disclosure.

FIG. 2 illustrates a plot 200 of the generally linear oscillator gain characteristic 201 of the phase locked loop, for example, of FIG. 1 used in accordance with one embodiment of the disclosure.

In FIGS. 1 and 2, $Y_{TUNE}$ denotes the digital control input, and $k_{DCO}$ is the oscillator gain. $y_{NOM}$ 131 is the nominal operation point, $y_1$ 111 and $y_2$ 121 are two other operation points. $K_{NOM}$ 130 denotes the oscillator control gain at the nominal operation point $y_{NOM}$ 131, whereas $k_1$ 110 and $k_2$ 120 are the gains at two other operation points.

In one prior art method, the gain is measured at only one operation point. Obviously, if the actual operation point used is not exactly at the measured operation point position, a gain estimation error occurs due to the nonlinearity of the control characteristic 101 as shown in FIG. 1. However, if the actual operation point is known, the linear gain relation can be used to compensate the gain for the deviation of the actual operation point from the nominal operation point where the nominal gain was calculated.

Therefore, in one embodiment of the disclosure, a proposed procedure comprises:

1) In an open loop mode, measure the oscillator frequency at upper (maximal) and lower (minimal) ends of the tuning range with a frequency counter, and calculate the gain in the center of the range (e.g., $K_{NOM}$ 130). This can be done because a linear gain characteristic is assumed.

2) Close the loop and wait until the frequency is settled.

3) Determine the actual operation point (e.g., using an oscillator control word). In a fully digital PLL the oscillator control word can be accessed easily since it is a digital signal.

4) Calculate the gain deviation from the nominal gain considering the linear gain relation. As mentioned before, the slope of the gain characteristic can be extracted from the design and is therefore known in advance.

Using the exemplary characteristics 101 and 201 from FIGS. 1 and 2, respectively, the calculation of the gain at operation points 1 and 2 (e.g., $y_1$ 111 and $y_2$ 121) can be done as follows:

(1) Calculate the Nominal Gain:

$$kNOM=(f(yMAX)-f(yMIN))/(yMAX-yMIN)$$

(2) Calculate the Gain of Operation Point 1:

$$k1=kNOM+kNL*(y1-yNOM)$$

(3) Calculate the Gain of Operation Point 2:

$$k2=kNOM+kNL*(y2-yNOM)$$

(4) kNL is Defined by:

$$kNL=(kDCO(yMAX)-kDCO(yMIN))/(yMAX-yMIN)$$

It is expected that the parameter kNL is sufficiently constant across process and temperature variations.

Accordingly, a phase locked loop based frequency modulator is provided in one embodiment for closed loop gain compensation and RF carrier modulation, for example. The frequency modulation system is suitable for base and mobile stations and other applications that could use accurate gain compensation for nonlinear DCOs or digital to analog converter based systems.

Alternately, the PLL can be locked closed loop at two different frequencies (e.g., frequencies (1) and (2)), and the change in the DCO tuning input at these two frequencies can be monitored. Thus, once again, the nominal DCO gain can be calculated according to:

$$kNOM=(f_{DCO}(1)-f_{DCO}(2))/(y_{DCO}(1)-y_{DCO}(2))$$

Therefore, the inventors have appreciated that the nominal gain characteristic of the DCO can be measured in open loop mode, closed loop mode, or a combination of open and closed loop modes, and thereafter, the actual gain is measured/determined in the closed loop mode using the nominal gain characteristic.

Figure 3:
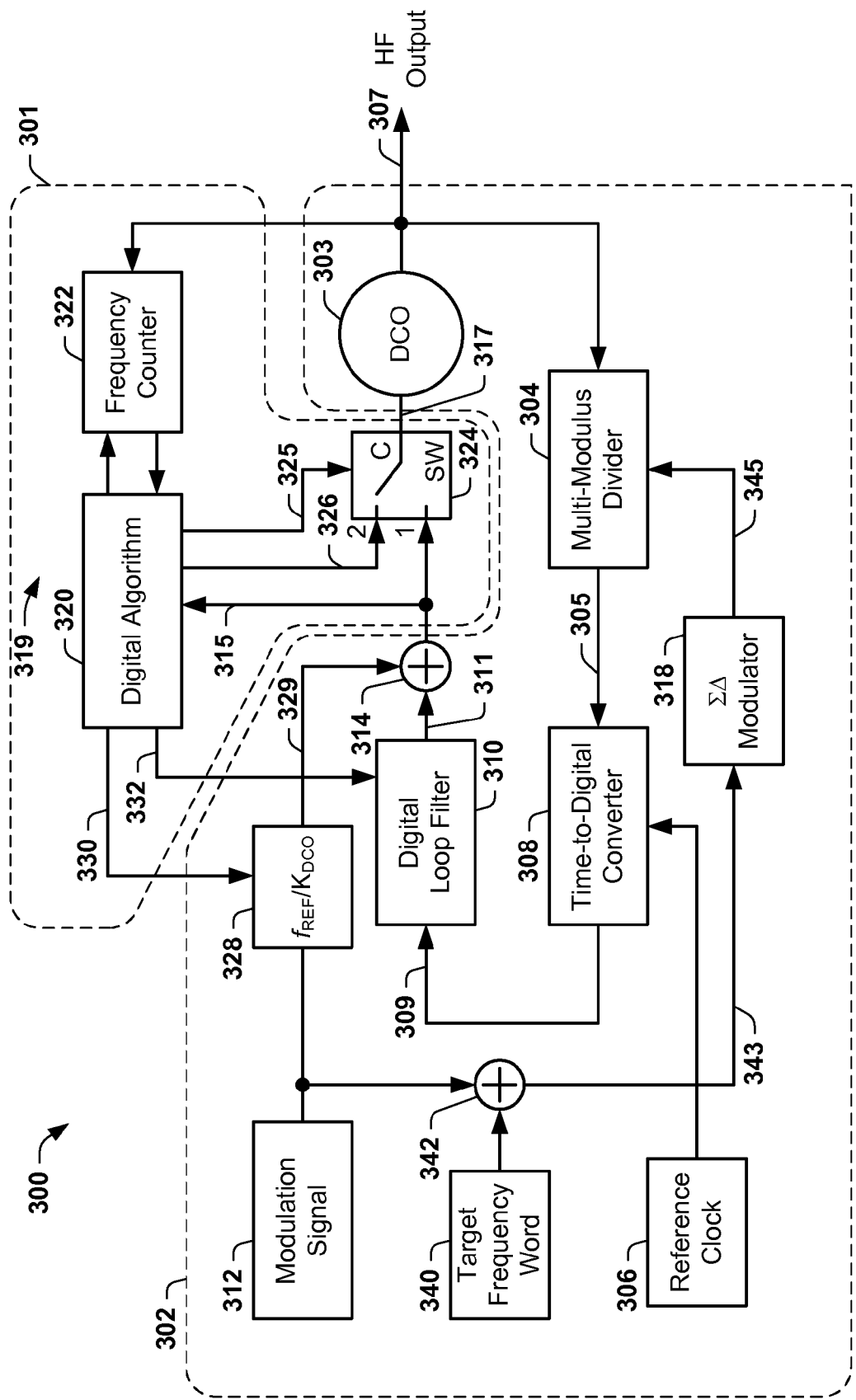
FIG. 3 is a simplified block diagram of a digital phase locked loop based frequency modulator utilizing accurate gain adjustment for frequency control, in accordance with one embodiment.

Turning now to FIG. 3, a simplified block diagram of a digital phase locked loop based frequency modulator 300 utilizing accurate gain adjustment, is illustrated in accordance with one embodiment. Frequency modulator 300 comprises a fully digital PLL, which is able to measure the gain of the oscillator with a very high accuracy by utilizing, for example, a frequency counter and a digital algorithm. The accuracy is effectively utilized to assure the quality requirements (e.g., phase error in GSM) of the output signal if the PLL is used as a frequency modulator for mobile radio systems. In one embodiment, for example, the frequency modulator 300 is operable to perform the previously mentioned functions and calculations (steps 1-4 above) to determine the gain deviation from the nominal gain considering the linear gain relation.

In one embodiment, the frequency modulator 300 of FIG. 3 comprises a tuning circuit 301 and a modulation circuit 302. The tuning circuit 301 is configured to determine a nominal gain characteristic of a DCO 303 in an open loop mode (e.g., position 2 of switch 324 of FIG. 3), and an actual gain characteristic of the DCO 303 in a closed loop mode (e.g., position 1 of switch 324 of FIG. 3) using the nominal gain characteristic. The modulation circuit 302 includes the DCO 303 coupled to the tuning circuit 301. The modulation circuit 302 is configured to modulate a frequency of a DCO output signal 307 from the DCO with a modulation signal input 312, and to scale the modulated DCO output signal 307 based on the actual gain characteristic in the closed loop mode to provide gain compensation and frequency modulation of the DCO 303.

In another embodiment, the DCO 303 is configured to generate the DCO output signal 307 based on an oscillator control word input 317 to the DCO. The tuning circuit 301 may also comprise a select switch 324 configured to couple one of, a controlled operating point word 326 in the open loop mode and an actual operating point word 315 in the closed loop mode to the oscillator control word input 317 of the DCO based on a selection control signal 325. The tuning circuit 301 may also comprise a digital algorithm circuit 319, for example, comprising a digital algorithm block 320 and a frequency counter 322, coupled to the select switch 324, the digital algorithm circuit 319 configured to supply the selection control signal 325 to the select switch for selection of the controlled operating point word 326 to the oscillator control word input 317 of the DCO 303 in the open loop mode, and for selection of the actual operating point word 315 to the oscillator control word input 317 of the DCO 303 in the closed loop mode. The digital algorithm circuit 319 is also configured to measure two or more frequencies of the DCO output signal 307 and determine the nominal gain characteristic of the DCO in the open loop mode based on the measured frequencies, and to determine the actual gain characteristic of the DCO 303 in the closed loop mode based on the determined nominal gain characteristic.

In one embodiment, the modulation circuit 302 of the frequency modulator 300 further comprises a modulation gain block 328 ($f_{REF}/K_{DCO}$) coupled to the modulation signal input 312 and a gain value output 330 of the digital algorithm circuit 319, configured to scale the modulation signal input 312 to a reciprocal 330 of the determined actual gain characteristic in the closed loop mode. The modulation circuit 302 also comprises a multi-modulus divider 304 coupled to the DCO output signal 307 at the DCO and to a sigma-delta modulator 318, configured to provide a divided DCO frequency signal output 305 divided according to a divider ratio signal 345 generated by the sigma-delta modulator 318, and a time-to-digital converter 308 coupled to the divided DCO frequency signal output from the multi-modulus divider 304 and a reference clock input 306 or reference frequency ($f_{REF}$) 306 of the PLL, configured to provide a digital error signal output 309 based upon a phase comparison between the divided DCO frequency signal 305 and the reference clock 306.

The modulation circuit 302 also comprises a digital loop filter 310 configured to receive and filter the digital error signal 309 that is output from the time-to-digital converter 308 and to generate modulation data 311 to a loop adder 314, the modulation data 311 scaled according to a gain adjustment output of the digital algorithm block 320, and the loop adder 314 configured to add the scaled modulation signal 329 from the modulation gain block 328 and the modulation data 311 from the digital loop filter 310, and generate the actual operating point word to the select switch in the closed loop mode.

In another embodiment, the modulation circuit may further comprise a modulation adder 342 configured to add the modulation signal input 312 and a target frequency word input 340 and generate a target frequency signal 343 to the sigma-delta modulator 318.

While the frequency modulator 300 will be described herein with one or more identified filters, complex filters or low-pass filters (LPF), dividers, modulators or sigma-delta modulators, converter, amplifiers, two or more adders, frequency counters, algorithm blocks, digitally controlled oscillator (DCO), as one example, it should be understood that many variations of such components and features can be made, and all such variations are contemplated as falling within the scope of the disclosure. Such frequency modulation and gain control can also be carried out by other means also contemplated within the scope of the disclosure.

During operation of the frequency modulator 300, the DCO 303 high frequency output signal 307 is fed to the multi-modulus-divider 304, which divides the signal 307 and thus reduces the frequency of DCO output signal 307 to approximately the frequency of the reference clock 306. The time-to-digital-converter 308 measures digitally the phase error between the reference clock signal 306 (or reference frequency ($f_{REF}$) 306 of the PLL) and the divided DCO signal 305 to generate a digital error signal 309. The digital error signal 309 is low pass filtered by a digital loop filter 310 to generate a modulation data signal 311. After the digital loop filter 310, the modulation signal 312 is added using loop adder 314 to the modulation data signal 311 as a filtered output signal of the loop filter 310. The resulting actual operating point signal 315 is used to digitally tune the DCO 303. The modulation signal 312 is also applied to the multi-modulus-divider 304 via a Sigma-Delta-modulator 318. In this way, 2-point modulation is achieved.

The digital algorithm block 320 controls the frequency counter 322 in order to measure the DCO gain at the minimal and maximal tuning values (e.g., y1 and y2). To be able to apply these values, a switch 324, which is also controlled by selection control signal 325 from the digital algorithm block 320, controls whether the DCO input signal 317 is taken from the digital filter 310 or from the digital algorithm block 320 via controlled operating point signal 326.

Furthermore, the digital algorithm block 320 can access the actual tuning word via actual operating point signal 315 provided from the digital loop filter 310. In this way, the operation point in the locked state can be evaluated. The gain for the modulation gain signal 329 is defined in (or scaled by) a modulation gain block $f_{REF}/K_{DCO}$ 328, and set by a gain value 330 generated by the digital algorithm block 320. Also, the digital loop filter 310 has an adjustable gain, which is also set by gain adjustment 332 generated by the digital algorithm block 320. The gain value 330 and the gain adjustment 332 generated by the digital algorithm block 320 may be set to a reciprocal of the determined gain (e.g., $1/K_{DCO}$).

The loop filter gain generally does not influence the modulation, as long as the modulation gain $1/K_{DCO}$ is set to an optimum (e.g., where KDCO is generally matched to the DCO). The loop filter gain generally only affects the dynamics of the PLL, which stabilizes the output center or carrier frequency. In one embodiment, the target frequency word input 340 and the reference clock 306 may be used to establish an RF carrier frequency.

Although the digital algorithm circuit 319 is illustrated in FIG. 3 and described herein as a digital algorithm block 320 coupled to a frequency counter 322, the frequency counter 322 or another such DCO monitoring circuit may be combined with or integrated into the digital algorithm block 320 to measure the DCO frequency or another suitable characteristic of the DCO from which the nominal gain and/or the actual gain may be computed by the digital algorithm block 320. Further, the selection switch 324 may be combined with or integrated into the digital algorithm block 320, and the switch 324 may be a mux, a gate, or another arrangement suitable to select one of the digital oscillator control words in one of the open and closed loop modes to the DCO, and all such variations and combinations of the aforementioned are contemplated herein.

Alternately again, the nominal gain characteristic of the DCO can be measured in open loop mode, closed loop mode, or a combination of open and closed loop modes, and thereafter, the actual gain is measured/determined in the closed loop mode using the nominal gain characteristic.

By contrast to prior art two-measurement method gain control systems, the frequency modulator 300 of FIG. 3 achieves improved performance and high accuracy oscillator gain control that is adjusted or compensated at the actual operating point, rather than simply relying on the assumption that the non-linear oscillator control characteristic (e.g., 101 of FIG. 1) is linear.

In addition to or in substitution of one or more of the illustrated components, the illustrated one or more filters, complex filters or low-pass filters (LPF), dividers, modulators or sigma-delta modulators, converter, amplifiers, two or more adders, frequency counters, algorithm blocks, digitally controlled oscillator (DCO), and other systems of the disclosure may include suitable circuitry, state machines, firmware, software, logic, etc. to perform the various methods and functions illustrated and described herein, including but not limited to the method(s) described below.

In one embodiment, a method is disclosed for frequency modulation (e.g., modulating DCO HF output 307 of DCO 303 with modulation signal 312 of FIG. 3) by determining a nominal gain (e.g., $K_{NOM}$ 130 of FIGS. 1 and 2) in one of an open loop mode (e.g., position 2 of switch 324 of FIG. 3) or a closed loop mode, and an actual gain (e.g., $k_1$ 120 of FIGS. 1 and 2) in a closed loop mode (e.g., position 1 of switch 324 of FIG. 3) to adjust the gain of the digitally controlled oscillator (DCO) 303 of a frequency modulator (e.g., 300 of FIG. 3).

The method includes selecting the open loop mode (e.g., position 2 of switch 324 of FIG. 3) of the frequency modulator (e.g., 300 of FIG. 3), tuning the DCO (e.g., 303 of FIG. 3) with a minimal tuning word value (e.g., yMIN of formulas (1) and (4) above applied to oscillator control word 317) and measuring (e.g., using frequency counter 322 of FIG. 3) the minimal DCO frequency ($f_{DCO}$), and tuning the DCO (e.g., 303 of FIG. 3) with a maximal tuning word value (e.g., yMAX of formulas (1) and (4) above applied to oscillator control word 317) and measuring (e.g., using frequency counter 322 of FIG. 3) the maximal DCO frequency ($f_{DCO}$), or selecting the closed loop mode (e.g., position 1 of switch 324 of FIG. 3) of the frequency modulator (e.g., 300 of FIG. 3), tuning the DCO (e.g., 303 of FIG. 3) to a minimal frequency ($f_{DCO}$) and measuring the minimal tuning word value (y), and tuning the DCO (e.g., 303 of FIG. 3) to a maximal frequency ($f_{DCO}$) and measuring the maximal DCO tuning word value (y). The method also includes determining (e.g., using digital algorithm block 320) the nominal gain (e.g., $K_{NOM}$ 130 of FIGS. 1 and 2) of the DCO based on the minimal and maximal DCO frequency measurements, applying a modulation signal (e.g., 312 of FIG. 3) to the frequency modulator (e.g., 300 of FIG. 3), and applying a reciprocal of the nominal gain (e.g., $1/K_{DCO}$ 330 and 332 of FIG. 3) to the frequency modulator (e.g., 300 of FIG. 3). Finally, the method includes selecting the closed loop mode (e.g., position 1 of switch 324 of FIG. 3) of the frequency modulator, determining the actual gain (e.g., $k_1$ 120 of FIGS. 1 and 2) of the DCO by reading the actual tuning word value (e.g., actual operating point word 315 of FIG. 3) at the DCO, determining (e.g., using digital algorithm block 320) a new gain value from the actual tuning word value (e.g., actual operating point word 315 of FIG. 3) in the closed loop mode (e.g., position 1 of switch 324 of FIG. 3), and applying a reciprocal of the new gain value (e.g., $1/K_{DCO}$ 330 and 332 of FIG. 3) to the frequency modulator (e.g., 300 of FIG. 3).

In another embodiment, the method further comprises waiting for a settling time of the frequency modulator (e.g., 300 of FIG. 3) to insure a locked state, before determining the actual gain (e.g., $k_1$ 120 of FIGS. 1 and 2) of the DCO (e.g., 303 of FIG. 3).

Although the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A frequency modulator, comprising:
   a tuning circuit configured to
      determine a nominal gain characteristic of a digitally controlled oscillator (DCO) in an first mode by ascertaining an oscillator output frequency solely at two different oscillator control inputs operating points, wherein a first operating point is near a maximum end of a tuning range of the DCO and a second operating point is near a minimum end of the tuning range of the DCO, and calculating the nominal gain characteristic therefrom, and
      determine an actual gain characteristic of the DCO in a second mode using the nominal gain characteristic; and
   a modulation circuit comprising the DCO coupled to the tuning circuit, configured to modulate a frequency of a DCO output signal from the DCO with a modulation signal, and to scale the modulation signal based on the actual gain characteristic in the second mode to provide gain compensation and frequency modulation of the DCO.

2. The frequency modulator of claim 1, wherein the first and second modes are closed loop modes.

3. The frequency modulator of claim 1, wherein the modulation signal input utilizes one of a UMTS, CDMA, WCDMA, GSM and 3GSM standard.

4. A frequency modulator, comprising:
a tuning circuit configured to
determine a nominal gain characteristic of a digitally controlled oscillator (DCO) in an first mode, and
determine an actual gain characteristic of the DCO in a second mode using the nominal gain characteristic; and
a modulation circuit comprising the DCO coupled to the tuning circuit, configured to modulate a frequency of a DCO output signal from the DCO with a modulation signal, and to scale the modulation signal based on the actual gain characteristic in the second mode to provide gain compensation and frequency modulation of the DCO,
wherein the first mode is an open loop mode and the second mode is a closed loop mode.

5. The frequency modulator of claim 4, wherein
the DCO is configured to generate the DCO output signal based on an oscillator control word input to the DCO; and
wherein the tuning circuit further comprises
a select switch configured to couple one of, a controlled operating point word in the open loop mode and an actual operating point word in the closed loop mode to the oscillator control word input of the DCO based on a selection control signal; and
a digital algorithm circuit coupled to the select switch, configured to supply the selection control signal to the select switch for selection of the controlled operating point word to the oscillator control word input of the DCO in the open loop mode, and for selection of the actual operating point word to the oscillator control word input of the DCO in the closed loop mode, and to measure two or more frequencies of the DCO output signal and determine the nominal gain characteristic of the DCO in the open loop mode based on the measured frequencies, and to determine the actual gain characteristic of the DCO in the closed loop mode based on the determined nominal gain characteristic.

6. The frequency modulator of claim 5, wherein the digital algorithm circuit is configured to wait until after a settling time of the frequency modulator to insure a locked state in the closed loop mode before determining the actual gain characteristic of the DCO.

7. The frequency modulator of claim 6, wherein the digital algorithm circuit comprises a frequency counter coupled to the DCO output signal, configured to measure the two or more frequencies of the DCO output signal in the open loop and closed loop modes.

8. The frequency modulator of claim 5, wherein the modulation circuit further comprises
a modulation gain block coupled to the modulation signal input and a gain value output of the digital algorithm circuit, configured to scale the modulation signal input to a reciprocal of the determined actual gain characteristic in the second mode;
a multi-modulus divider coupled to the DCO output signal at the DCO and to a sigma-delta modulator, configured to provide a divided DCO frequency signal output divided according to a divider ratio signal generated by the sigma-delta modulator;
a time-to-digital converter coupled to the divided DCO frequency signal output from the multi-modulus divider and a reference clock input, configured to provide a digital error signal output based upon a phase comparison between the divided DCO frequency signal and the reference clock;
a digital loop filter configured to receive and filter the digital error signal that is output from the time-to-digital converter and to generate modulation data to a loop adder, the modulation data scaled according to a gain adjustment output of the digital algorithm block; and
the loop adder configured to add the scaled modulation signal from the modulation gain block and the modulation data from the digital loop filter, and generate the actual operating point word to the select switch in the second mode.

9. The frequency modulator of claim 8, wherein the modulation circuit further comprises
a modulation adder configured to add the modulation signal input and a target frequency word input and generate a target frequency signal to the sigma-delta modulator.

10. The frequency modulator of claim 9, wherein the target frequency word input and the reference clock are used to establish an RF carrier frequency.

11. The frequency modulator of claim 9, wherein the target frequency signal comprises integer and fractional components.

12. The frequency modulator of claim 8, wherein the digital loop filter is configured to integrate and low-pass filter the digital error signal in the generation of the modulation data.

13. A frequency modulator, comprising:
a digitally controlled oscillator (DCO), configured to supply a DCO output signal from the DCO based on an oscillator control word input;
a select switch configured to couple one of an actual operating point word in a closed loop mode, and a controlled operating point word in an open loop mode to the oscillator control word input of the DCO based on a selection control signal;
a frequency counter coupled to the DCO output signal, configured to measure a frequency of the DCO;
a digital algorithm block coupled to the frequency counter and the select switch, configured to supply the selection control signal to the select switch for selection of the controlled operating point word to the oscillator control word input of the DCO in the open loop mode, and for selection of the actual operating point word to the oscillator control word input of the DCO in the closed loop mode, to read two or more of the measured frequencies from the frequency counter and determine a nominal gain for the DCO in the open loop mode based on the measured frequencies, and to determine an actual operating point gain for the DCO after a settling time to insure a locked state in the closed loop mode; and
a modulation circuit coupled to the DCO output signal at the DCO, the digital algorithm block and the select switch, configured to modulate the DCO output signal with a modulation signal input scaled according to a reciprocal of the determined actual operating point gain in the closed loop mode, and to provide the actual operating point word to the select switch for closed loop control of the DCO frequency.

14. The frequency modulator of claim 13, wherein the modulation circuit further comprises
a modulation gain block coupled to the modulation signal input and a gain value output of the digital algorithm block, configured to scale the modulation signal input to the reciprocal of the determined actual operating point gain in the closed loop mode;

a multi-modulus divider coupled to the DCO output signal at the DCO and to a sigma-delta modulator, configured to provide a divided DCO frequency signal output divided according to a divider ratio signal generated by the sigma-delta modulator;

a time-to-digital converter coupled to the divided DCO frequency signal output from the multi-modulus divider and a reference clock input, configured to provide a digital error signal output based upon the frequency difference between the divided DCO frequency signal and the reference clock;

a digital loop filter configured to receive and filter the digital error signal that is output from the time-to-digital converter and to generate modulation data to a loop adder, the modulation data scaled according to a gain adjustment output of the digital algorithm block; and the loop adder configured to add the scaled modulation signal from the modulation gain block and the modulation data from the digital loop filter, and generate the actual operating point word to the select switch in the closed loop mode.

15. The frequency modulator of claim 14, wherein the modulation circuit further comprises a modulation adder configured to add the modulation signal input and a target frequency word input and generate a target frequency signal to the sigma-delta modulator.

16. The frequency modulator of claim 15, wherein the target frequency word input and the reference clock are used to establish an RF carrier frequency.

17. The frequency modulator of claim 13, wherein the modulation signal input utilizes one of a UMTS, CDMA, WCDMA, GSM and 3GSM standard.

18. The frequency modulator of claim 13, wherein the digital loop filter is configured to integrate and low-pass filter the digital error signal in the generation of the modulation data.

19. A frequency modulator, comprising:

measuring means operable to measure and determine a nominal gain characteristic of a digitally controlled oscillator (DCO) in an open loop mode;

determining means operable to determine an actual gain characteristic of the DCO in a closed loop mode using the nominal gain characteristic;

modulating means operable to frequency modulate a DCO output signal of the DCO with a modulation signal input; and amplifying means operable to scale the modulated DCO output signal based on the actual gain characteristic in the closed loop mode to provide gain compensation and frequency modulation of the DCO.

20. The frequency modulator of claim 19, comprising a switching means operable to select one of a controlled operating point word in the open loop mode and an actual operating point word in the closed loop mode to an oscillator control word input of the DCO.

21. The frequency modulator of claim 20, comprising a digital algorithm control means operable to generate the controlled operating point word to the oscillator control word input of the DCO for the measuring means to measure and determine a nominal gain characteristic of the DCO in the open loop mode, and the actual operating point word to the oscillator control word input of the DCO for the determining means to determine an actual gain characteristic of the DCO in a closed loop mode using the nominal gain characteristic.

22. A method for direct carrier frequency modulation by determining a nominal gain in one of an open loop mode and a closed loop mode and an actual gain in the closed loop mode to adjust the gain of the digitally controlled oscillator (DCO) of a frequency modulator, the method comprising:

selecting one of the open and closed loop modes of the frequency modulator;

tuning the DCO with a minimal tuning word value and measuring the minimal DCO frequency near a minimal end of a tuning range of the DCO;

tuning the DCO with a maximal tuning word value and measuring the maximal DCO frequency near a maximal end of a tuning range of the DCO;

determining the nominal gain of the DCO based solely on the minimal and maximal DCO frequency measurements;

applying a modulation signal to the frequency modulator;

applying a reciprocal of the nominal gain to the frequency modulator;

selecting the closed loop mode of the frequency modulator;

determining the actual gain of the DCO by reading the actual tuning word value at the DCO;

determining a new gain value from the actual tuning word value in the closed loop mode; and applying a reciprocal of the new gain value to the frequency modulator.

23. The method of claim 22, comprising waiting for a settling time of the frequency modulator to insure a locked state, before determining the actual gain of the DCO.

* * * * *